(12) United States Patent
Muraki

(10) Patent No.: US 6,242,694 B1
(45) Date of Patent: *Jun. 5, 2001

(54) PACKAGE FOR HOUSING A PHOTOSEMICONDUCTOR DEVICE

(75) Inventor: Ichiro Muraki, Mine (JP)

(73) Assignee: Sumitomo Metal (SMI) Electronics Devices Inc., Mine (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,239

(22) Filed: Nov. 18, 1998

(30) Foreign Application Priority Data

Dec. 2, 1997 (JP) ................................. 9-348571
Sep. 18, 1998 (JP) ................................ 10-283273

(51) Int. Cl.⁷ ................................................ H05K 5/06
(52) U.S. Cl. ................... 174/52.3; 174/52.2; 174/52.4; 257/698; 257/699; 257/708
(58) Field of Search ..................... 174/52.2, 52.4, 174/52.3; 257/698, 699, 708

(56) References Cited

U.S. PATENT DOCUMENTS

| 5,247,134 | * | 9/1993 | Beltz | 174/52.4 |
| 5,285,106 | * | 2/1994 | Deie | 257/678 |
| 5,374,786 | * | 12/1994 | Weger | 174/52.4 |
| 5,434,358 | * | 7/1995 | Glahn et al. | 174/52.4 |
| 5,744,848 | | 4/1998 | Jarazono | 257/433 |

* cited by examiner

Primary Examiner—William A. Cuchlinski, Jr.
Assistant Examiner—Ronnie Mancho
(74) Attorney, Agent, or Firm—Armstrong, Westerman, Hattori, McLeland & Naughton, LLP

(57) ABSTRACT

A package for housing a photosemiconductor including a plurality of united-inner/outer-portions type leads each of which has an inner lead portion and an outer lead portion continuously formed into one body; a conductive frame having a side wall and an opening provided on the side wall for introducing the inner lead portions of the plurality of united-inner/outer-portions type leads into an inside of the conductive frame; and a ceramic plate which has a side face for stopping up the opening of the side wall of the conductive frame. The ceramic plate has a plurality of through holes on the side face for inserting the inner lead portions of the plurality of united-inner/outer-portions type leads therethrough. The ceramic plate is joined with the conductive frame so that the side face stops up the opening of the conductive frame.

5 Claims, 5 Drawing Sheets

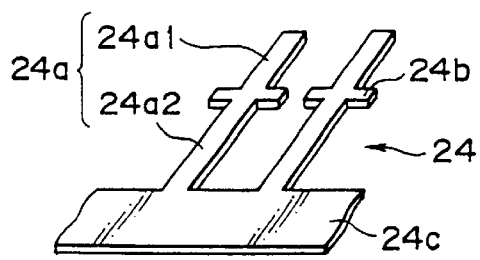
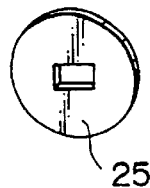
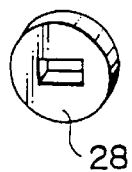
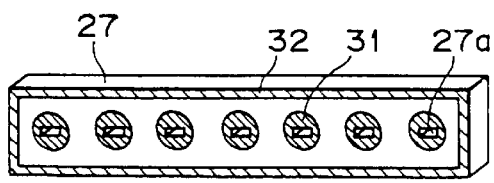
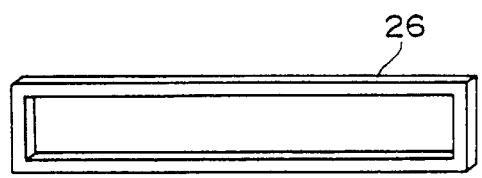
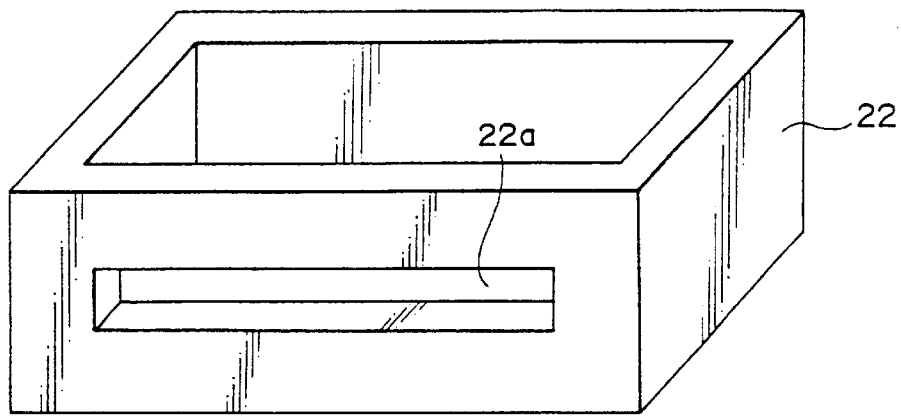
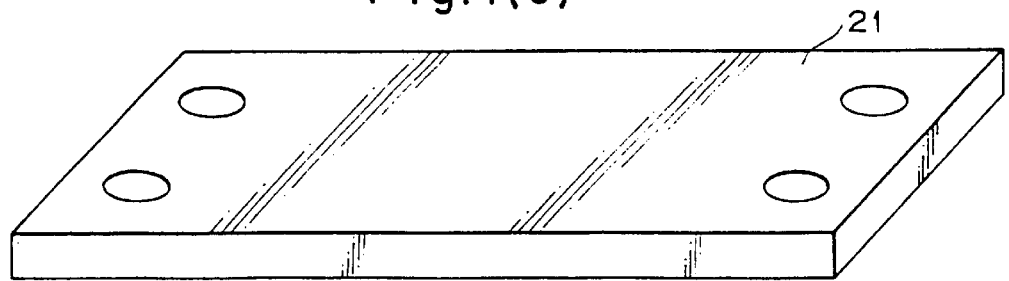

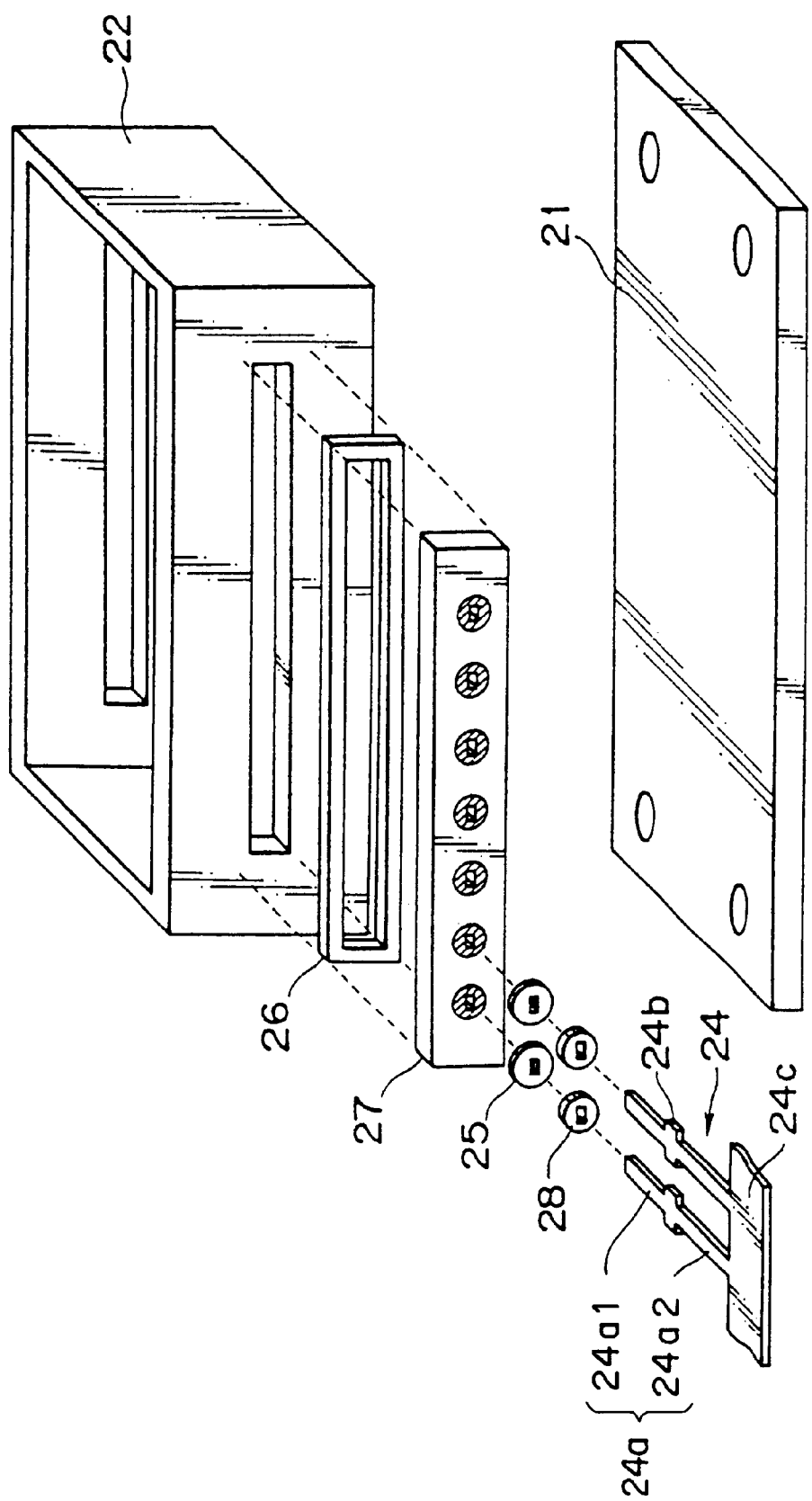

Fig. 5
PRIOR ART
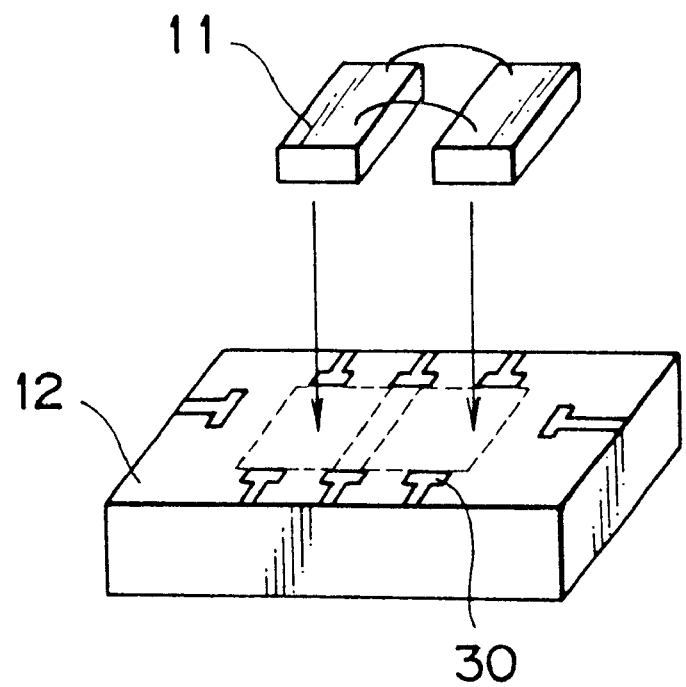
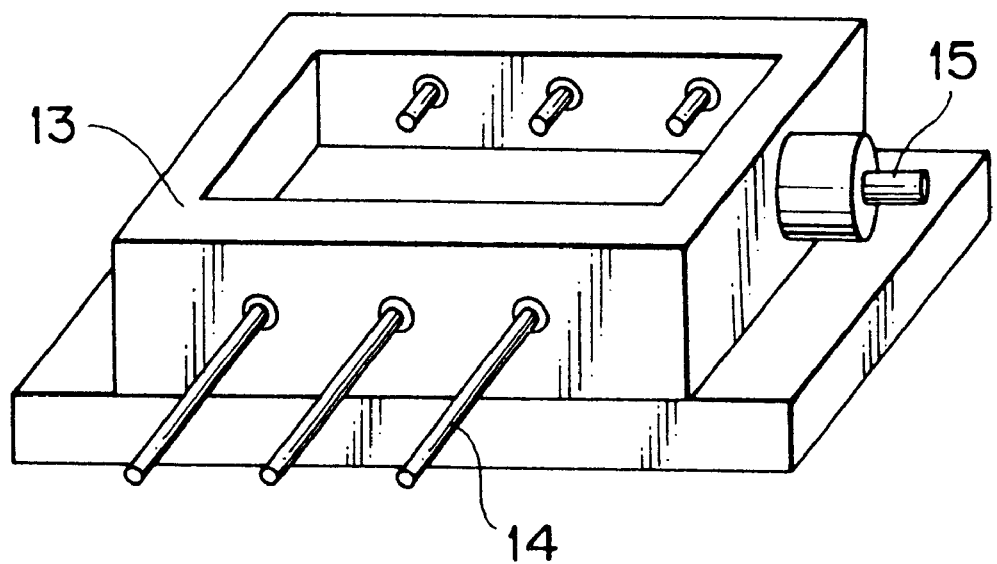

PACKAGE FOR HOUSING A PHOTOSEMICONDUCTOR DEVICE

BACKGROUND OF THE INVENTION

1. Field of the Invention

The present invention relates to a package for housing a photosemiconductor device being capable of hermetically sealing the photosemiconductor device and holding an optical fiber for transferring optical signals from and to the photosemiconductor device, and more particularly to a package for housing a photosemiconductor device provided with leads of a united-inner/outer-portions type.

2. Description of the Prior Art

FIG. 4(a) is a plan view of a conventional package for housing a photosemiconductor device. FIG. 4(b) is a sectional view taken along the line A—A of the package of FIG. 4(a). In FIGS. 4(a) and 4(b) reference number 1 indicates a base plate composed of a metal material such as a copper-tungsten alloy or the like, 2 indicates a frame composed of a metal material such as an iron-nickel-cobalt alloy or the like, and 3 indicates a holder inserted into a side wall of said frame 2 in order to introduce an optical fiber into the inside of the frame 2. Said frame 2 needs to be composed of a conductive material made of metal or the like for the purpose of radio-wave shielding or the like.

In FIG. 4(a), indicates a united-inner/outer-portions type lead frame in which each lead has its inner lead portion and outer lead portion continuously formed into one body. Such a united-inner/outer-portions type lead frame 4 is composed of a metal material such as an iron-nickel-cobalt alloy, for example.

In FIGS. 4(a) and 4(b) indicates a strip portion forming one part of said lead frame 4. And 4a indicates a plurality of united-inner/outer-portions type leads which form the other part of said lead frame 4 and each of which is formed so as to project from said strip portion 4b.

Each of said plurality of united-inner/outer-portions type leads 4a is divided into an inner lead portion 4a1 and an outer lead portion 4a2. The inner lead portion 4a1 is a portion of said united-inner/outer-portions type lead 4a to be introduced into the inside of said frame 2. And the outer lead portion 4a2 is a portion of said united-inner/outer-portions type lead 4a to be outside said frame 2.

As shown in FIGS. 4(a) and 4(b), said plurality of united-inner/outer-portions type leads 4a are inserted through a plurality of lead-inserted through holes 5 formed in a side wall of said frame 2. And each of these inserted united-inner/outer-portions type leads 4a is joined to the frame 2 by means of sealing materials of glass 6. The inside of said frame 2 is hermetically sealed by stopping up said plurality of lead-inserted through holes 5 with said sealing materials of glass 6.

FIG. 5 shows an example of housing a photosemiconductor device in a package. In FIG. 5, 11 indicates a photosemiconductor device, 12 indicates an insulating plate made of ceramic on which the photosemiconductor device 11 is mounted, 13 indicates a frame made of metal in which the insulating plate 12 having the photosemiconductor device 11 mounted thereon is sealed, 14 indicates a plurality of united-inner/outer-portions type leads which are introduced into the inside of said frame 13 through a plurality of through holes formed in a side wall of this frame 13, and 15 indicates an optical fiber introduced into the inside of said frame 13 through a hole formed in another side wall of said frame 13. In the example shown in FIG. 5, a plurality of conductive patterns 30 on the insulating plate 12 and the inner lead portions of said plurality of united-inner/outer-portions type leads 14 are electrically connected with each other by means of soldering.

In FIGS. 4(a) and 4(b), the package for housing a photosemiconductor device provided with united-inner/outer-portions type leads secures insulation between said plurality of united-inner/outer-portions type leads 4a composed of a metal material such as an iron-nickel-cobalt alloy for example and said frame 2 composed of a metal material such as an iron-nickel-cobalt alloy for example, and secures airtightness of the inside of said frame 2 by stopping up said plurality of through holes 5 formed in a side wall of said frame 2 for inserting said plurality of united-inner/outer-portions type leads 4a through them with the sealing materials of glass 6.

As described above, in the package for housing a photosemiconductor device shown in FIGS. 4(a) and 4(b), the frame 2 is made of a metal material such as an iron-nickel-cobalt alloy or the like, and the base plate 1 is made of a metal material such as a copper-tungsten alloy or the like.

In such a way, the conventional package for housing a photosemiconductor device is being put together by combining a plurality of components such as said frame 2, said base plate 1 and the like which are made of different kinds of metal materials being different in thermal expansion coefficient from one another. When environmental tests including a thermal shock test and the like are applied to a conventional package for housing a photosemiconductor device, therefore, a problem often happens that said sealing materials of glass 6 are cracked due to strains generated in joint portions of a plurality of components made of said metal materials being different in thermal expansion coefficient from one another and airtightness of the inside of said frame 2 is impaired. Particularly, since said sealing materials of glass 6 are liable to be cracked by nature, they have a disadvantage of being more liable to be cracked under environmental tests including a thermal shock test and the like.

SUMMARY OF THE INVENTION

The present invention has been performed paying attention to the problem of the prior art, and an object of the invention is to provide a package for housing a photosemiconductor device provided with united-inner/outer-portions type leads, said package being capable of greatly improving the reliability of airtightness of the inside of its frame.

The present invention is a package for housing a photosemiconductor device, said package comprising: a plurality of united-inner/outer-portions type leads each of which has an inner lead portion and an outer lead portion continuously formed into one body; a conductive frame having an opening formed in said conductive frame for introducing the inner lead portions of said united-inner/outer-portions type leads into the inside of said conductive frame; and a ceramic plate has a side face for stopping up the opening of said side wall of said conductive frame, said ceramic plate having a plurality of through holes in said side face for inserting the inner lead portions of said plurality of united-inner/outer-portions type leads there through, said ceramic plate being joined with said conductive frame so that said side face stops up the opening of said conductive frame.

Further, in the package for housing a photosemiconductor device according to the present invention, said ceramic plate is joined with said conductive frame from the outside of said conductive frame.

Furthermore, in the package for housing a photosemiconductor device according to the present invention, a metalization layer for making it possible to join said ceramic plate to said conductive frame by means of a brazing material is formed on the edge of said side face of said ceramic plate to be joined to said conductive frame.

Still more, in the package for housing a photosemiconductor device according to the present invention, metalization layers for making it possible to join parts of the inner lead portions of said plurality of united-inner/outer-portions type leads to said ceramic plate by means of brazing materials are formed on the inside wall portions and on the peripheral portions of said plurality of through holes of said ceramic plate.

Yet more, in the package for housing the photosemiconductor device according to the present invention, projection-shaped stoppers for preventing said outer lead portions from being introduced into the inside of said frame through a plurality of through holes of said ceramic plate while permitting said inner lead portions to be introduced into the inside of said frame through a plurality of through holes of said ceramic plate are respectively formed in the middle parts of said plurality of united-inner-portions type leads.

BRIEF DESCRIPTION OF THE DRAWINGS

FIGS. 1(a) to 1(g) are perspective views, respectively, showing a plurality of components forming a package for housing a photosemiconductor device according to an embodiment of the present invention.

FIG. 2 shows a method for assembling the respective components shown in FIGS. 1(a) to 1(g).

FIG. 5 shows a plurality of components forming a conventional package for housing a photosemiconductor device, said package being of a type in which the photosemiconductor device is electrically connected to a plurality of united-inner/outer-portions type leads.

DESCRIPTION OF A PREFERRED EMBODIMENT

Figure 3:
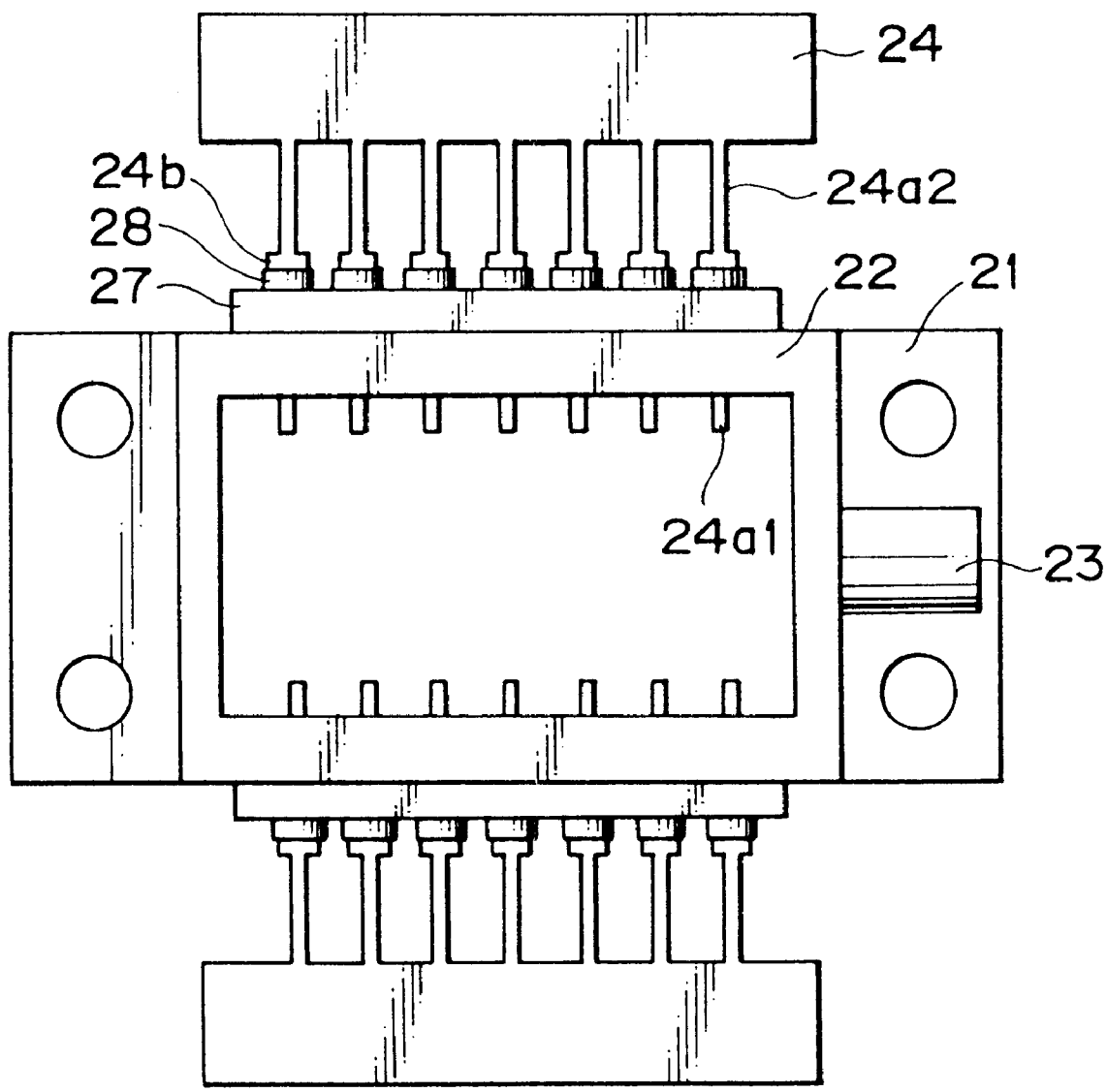
FIG. 3 is a plan view showing a package for housing a photosemiconductor device, said package being put together assembling the components shown in FIGS. 1(a) to 1(g).

FIGS. 1(a) to 1(g) show a plurality of components forming a package for housing a photosemiconductor device according to an embodiment of the present invention.

In FIG. 1(a), 24 indicates a united-inner/outer-portions type lead frame in which each lead has its inner lead portion and outer lead portion continuously formed into one body. Said united-inner/outer-portions type lead frame 24 is composed of a metal material such as an iron-nickel-cobalt alloy, for example. And in FIG. 1(a), 24a indicates a plurality of united-inner/outer-portions type leads contained in said lead frame 24, 24b indicates projection-shaped stoppers respectively formed in the middle parts of said plurality of united-inner/outer-portions type leads 24a, and 24c indicates a strip portion. Each of said plurality of united-inner/outer-portions type leads 24a is divided by said stopper 24b acting as the boundary between an inner lead portion 24a1 to be introduced into the inside of a frame 22 described later and an outer lead portion 24a2 to be located outside the frame 22 described later.

In FIG. 1(b), 22 indicates a conductive frame. This frame 22 is composed of a metal material such as an iron-nickel-cobalt alloy, for example. This frame 22 has an opening 22a provided on a side wall of frame 22 for inserting said plurality of united-inner/outer-portions type leads 24a through the opening 22a.

In FIG. 1(c), 21 indicates a base plate. This base plate 21 is composed of a metal material such as a copper-tungsten alloy, for example. Said frame 22 is set on this base plate 21.

In FIG. 1(d), 27 indicates a ceramic plate. This ceramic plate 27 introduces said plurality of united-inner/outer-portions type leads 24a into the inside of said frame 22 while holding them, and hermetically seals the inside of the frame 22 by stopping up the opening 22a of said frame 22.

This ceramic plate 27 is composed of alumina, glass-ceramic, aluminum-nitride, silicon-nitride, silicon-carbide or mullite for example, as a material for it.

This ceramic plate 27 has a plurality of through holes 27a for inserting said plurality of united-inner/outer-portions type leads 24a through them in the direction perpendicular to a side face of said ceramic plate 27. And metalization layers 31 are formed on the inner wall portions and the peripheral portions of said through holes 27a. The metalization layers 31 make it possible to join parts of the inner lead portions 24a1 of said plurality of united-inner/outer-portions type leads 24a to the plurality of through holes 27a of said ceramic plate 27 by means of brazing materials such as silver solder or the like.

Referring to FIGS. 1(b) and 1(d), the ceramic plate 27 has a side face for stopping up the opening 22a formed in said frame 22. A metalization layer 32 is formed on the edge of the side face so as to be joined to the side face of said frame 22. This metalization layer 32 makes it possible to join said ceramic plate 27 to said frame 22 by means of a brazing material such as silver solder or the like.

In FIG. 1(e), 25 indicates a perforated disk which is composed of silver solder and has a hole in the middle of it. This perforated disk 25 is used for joining a part of each of inner lead portions 24a1 of said plurality of united-inner/outer-portions type leads 24a to said ceramic plate 27.

In FIG. 1(f), 28 indicates a flange composed of a metal material such as an iron-nickel-cobalt alloy, for example. This flange 28 acts to prevent the flowing silver solder generated by melting said perforated disk 25 from running out to said outer lead portion 24a2.

In FIG. 1(g), 26 indicates a perforated plate which is made of silver solder and has a large opening in the middle of it. This perforated plate 26 acts to join the metalization layer 32 of said ceramic plate 27 and the peripheral portion of the opening 22a of said frame 22 to each other. By joining said ceramic plate 27 to the peripheral portion of said opening 22a by means of this perforated plate 26 so as to stop up said opening 22a of said frame 22, the inside of said frame 22 is hermetically sealed.

FIG. 2 shows a method for assembling said plurality of components described above with reference to FIGS. 1(a) to 1(g). A package for housing a photosemiconductor device as shown in FIG. 3 is formed by assembling them in such a way as shown in FIG. 2.

Next, FIG. 3 is a plan view showing a package for housing a photosemiconductor device, which is formed by assembling the plurality of components described with reference to FIGS. 1(a) to 1(g). In a package for housing a photosemiconductor device shown in FIG. 3, said frame 22 composed of an iron-nickel-cobalt alloy for example is joined onto said base plate 21 composed of a copper-tungsten alloy for example. A holder 23 for introducing an optical fiber into the inside of the frame 22 is inserted into one side wall of the frame 22.

As shown in FIG. 3, the side face of said ceramic plate 27 is joined onto the outer surface of the other side wall of said frame 22 by means of silver soldering so as to stop up the opening 22a of said frame 22 from the outside. The inner lead portions 24a1 of said plurality of united-inner/outer-portions type leads 24a are respectively inserted through said plurality of through holes 27a formed in this ceramic plate 27 in the direction perpendicular to the side face of said ceramic plate 27. Parts of said plurality of inner lead portions 24a1 are respectively joined to said ceramic plate 27 by means of said plurality of perforated disks 25 (illustration of these perforated disks is omitted in FIG. 3) and said metalization layers 31. Thus, the inner lead portions 24a1 of said plurality of united-inner/outer-portions type leads 24a are introduced into the inside of said frame 22 while being held by said ceramic plate 27.

Further, as shown in FIG. 3, said plurality of flanges 28 are put between the stoppers 24b of said lead frame 24 and said ceramic plate 27 in order to prevent the flowing silver solder generated by melting said perforated disks 25 from running out to said outer lead portions 24a2 when parts of said inner lead portions 24a1 are joined to said ceramic plate 27.

When the inner lead portions 24a1 of said plurality of united-inner/outer-portions type leads 24a are respectively inserted through the plurality of through holes 27a of said ceramic plate 27, said plurality of projection-shaped stoppers 24b respectively formed in the middle of said plurality of united-inner/outer-portions type leads 24a strike against said plurality of flanges 28 and thereby said plurality of united-inner/outer-portions type leads 24a are stopped at the strike position so that they are not inserted to a more inner position than the position where they strike against the flanges 28. That is to say, by a fact that said plurality of stoppers 24b strike, respectively, against the flanges 28, the outer lead portions 24a2 of said united-inner/outer-portions type leads 24a are prevented from being inserted into the inside of the frame 22.

Therefore, said plurality of projection-shaped stoppers 24b perform a function of preventing said outer lead portions 24a2 formed continuously with said inner lead portions 24a1 into one body from being introduced into the inside of said frame 22 through said plurality of through holes 27a of said ceramic plate 27 while permitting said inner lead portions 24a1 of said plurality of united-inner/outer-portions type leads 24a to be introduced into the inside of said frame 22 through said plurality of through holes 27a of said ceramic plate 27.

Figure 4A:
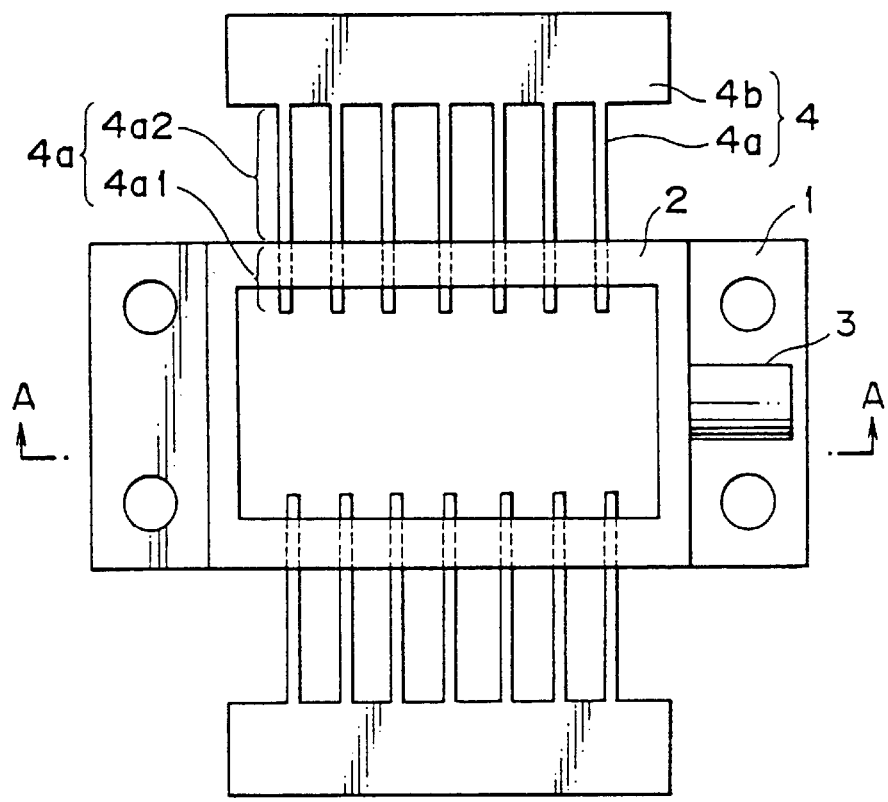
FIG. 4(a) is a plan view showing a conventional package for housing a photosemiconductor device.
Figure 4B:
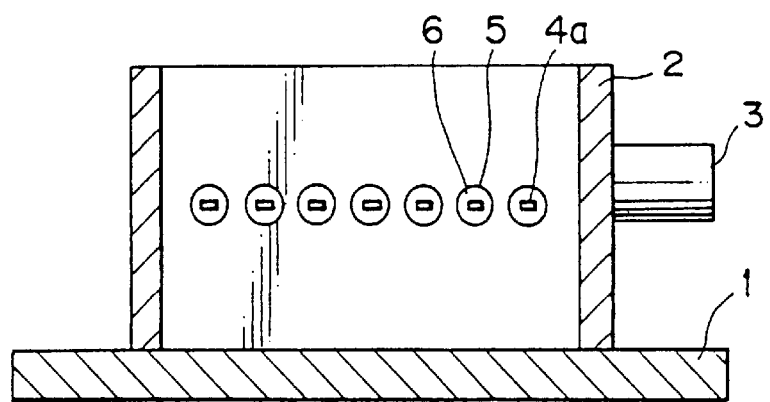
FIG. 4(b) is a sectional view taken along the line A—A of the package shown in FIG. 4(a).

As described above, when introducing the inner lead portions 24a1 of the plurality of united-inner/outer-portions type leads 24a of a lead frame 24 into the inside of said conductive frame 22, this embodiment uses the ceramic plate 27 in place of the sealing materials of glass as shown by the symbol 6 in FIG. 4(b) as means for insulating said plurality of united-inner/outer-portions type leads 24a and said frame 22 from each other and for hermetically sealing the inside of said frame 22. This ceramic plate 27 is much stronger in comparison with the conventional sealing materials of glass 6. Thanks to this, this embodiment can prevent a trouble from happening that "Airtightness of the inside of a frame of a package for housing a photosemiconductor device is impaired by a fact that sealing materials of the frame are cracked" under environmental tests including a thermal shock test and the like.

Thus, in the package for housing a photosemiconductor device according to the present invention, it is possible to greatly improve the reliability with respect to airtightness of the inside of the frame of a package for housing a photo-semiconductor device, said package being formed by using united-inner/outer-portions type leads.

What is claimed is:

1. A package for housing a photosemiconductor device, said package comprising:

a plurality of united-inner/outer-portions type leads each of which has an inner lead portion and an outer lead portion continuously formed into one body;

a base plate composed of a metal material;

four side walls composed of a metal material, said four side walls surrounding a photosemiconductor device, said four side walls being respectively and directly joined with said base plate, one of said four side walls having therein an opening for introducing the inner lead portions of said plurality of united-inner/outer-portions type leads into the inside of said side walls; and a ceramic plate which has a side face for stopping up the opening of said side wall, said ceramic plate having a plurality of through holes on said side face for inserting the inner lead portions of said plurality of united-inner/outer-portions type leads therethrough, said ceramic plate being joined with a peripheral portion of the opening of said side wall so that said side face stops up the opening of said side wall.

2. The package for housing a photosemiconductor device as defined in claim 1, wherein said ceramic plate is joined with said metal frame from an outside of said metal frame.

3. The package for housing a photosemiconductor device as defined in claim 2, wherein a metalization layer for making it possible to join said ceramic plate to said metal frame by means of a brazing material is formed on an edge of the side face of said ceramic plate to be joined to said metal frame.

4. The package for housing a photosemiconductor device as defined in claim 2, wherein metalization layers for making it possible to join parts of the inner lead portions of said plurality of united-inner/outer-portions type leads to said ceramic plate by means of brazing materials are formed on inside wall portions and on peripheral portions of said plurality of through holes of said ceramic plate.

5. The package for housing a photosemiconductor device as defined in claim 2, wherein projection-shaped stoppers are respectively formed in middle parts of said plurality of united-inner/outer-portions type leads.

* * * * *